United States Patent
Cowley et al.

(10) Patent No.: US 6,895,063 B1
(45) Date of Patent: May 17, 2005

(54) FREQUENCY CHANGER AND DIGITAL TUNER

(75) Inventors: Nicholas P Cowley, Wroughton (GB); Mark S. J Mudd, Swindon (GB)

(73) Assignee: Zarlink Semiconductor Limited, Wiltshire (GB)

( * ) Notice: Subject to any disclaimer, the term of this patent is extended or adjusted under 35 U.S.C. 154(b) by 732 days.

(21) Appl. No.: 09/590,332

(22) Filed: Jun. 8, 2000

(51) Int. Cl.[7] .............................................. H03D 3/24
(52) U.S. Cl. ..................... 375/376; 455/208; 455/76; 331/45; 331/17; 329/308
(58) Field of Search ........................ 375/376; 455/208

(56) References Cited

U.S. PATENT DOCUMENTS

| | | | | |
|---|---|---|---|---|
| 4,607,393 A | * | 8/1986 | Nolde et al. ................ | 455/208 |
| 5,789,987 A | * | 8/1998 | Mittel et al. ................. | 331/17 |
| 5,896,061 A | * | 4/1999 | Behrent ....................... | 329/308 |
| 6,188,291 B1 | * | 2/2001 | Gopinathan et al. .......... | 331/45 |
| 6,370,360 B1 | * | 4/2002 | Kunkel ........................ | 455/76 |

FOREIGN PATENT DOCUMENTS

| EP | 0253680 | * | 7/1987 |
|---|---|---|---|
| GB | 2319913 | * | 3/1998 |

OTHER PUBLICATIONS

Shahani et al., A 115mW CMOS GPS Receiver, Dec. 1998, ISSCC98 paper Ref. FA 8.1.*
Ulrich L. Rohde, Digital PLL Frequency Synthesizers, 1983, Prentice Hall, ISBN 013 214 293-2.*
Floyd M. Gardner, Phaselock Techniques, Second Edition, 1979, Chapter 10, pp. 208–209.*

* cited by examiner

*Primary Examiner*—Stephen Chin
*Assistant Examiner*—Sudhanshu C. Pathak
(74) *Attorney, Agent, or Firm*—Kirschstein, et al.

(57) ABSTRACT

A zero or near zero IF frequency changer for use in a digital tuner comprises multipliers which receive the RF input signal from an input. The multipliers receive quadrature local oscillator signals from a first oscillator of an arrangement which comprises first and second phase-locked loops. The first phase-locked loop comprises a programmable divider, a comparator and a control loop so that the first oscillator is phase-locked to a second oscillator. A second phase-locked loop comprises the second oscillator and a synthesizer containing a reference oscillator to which the second oscillator is phase-locked. The output frequency of the second oscillator is in a frequency band which is outside the RF input frequency band of the frequency changer.

38 Claims, 5 Drawing Sheets

FREQUENCY CHANGER AND DIGITAL TUNER

BACKGROUND OF THE INVENTION

1. Field of the Invention

The present invention relates to a frequency changer. Such a frequency changer may, for example, be used as part of a zero intermediate frequency (ZIF) tuner, for instance, for a digital direct broadcasting by satellite (DBS) receiver system. The present invention also relates to a digital tuner. In general, the invention may be applied to any tuner where a received channel contains a local oscillator frequency.

2. Description of the Prior Art

A known type of digital tuner for use in a DBS system is illustrated in FIG. 1 of the accompanying drawings and is based on the well-known super-heterodyning technique, which has been used in analogue tuners for many decades. An antennae input 1 for receiving an input signal from an antennae system is connected to the input of a radio frequency (RF) amplifier 2, which comprises a low noise amplifier 3 and an automatic gain control (AGC) arrangement 4. The RF amplifier 2 is connected to a frequency changer via a tracking bandpass filter 60 tuned to pass the selected channel.

The RF amplifier 2 and the filter 60 form a "front end" which is external to the frequency changer for down-converting the input RF signal to a lower fixed intermediate frequency (IF) which is typically 402 or 480 MHz. The frequency changer comprises a first integrated circuit 5 which comprises an amplifier 6, a multiplier 7, an amplifier 8, and an oscillator 9. The oscillator 9 has an off-chip variable tuned circuit 10 which determines the frequency of oscillation of the oscillator 9 and whose resonant frequency is controlled by a phase-locked loop (PLL) frequency synthesiser 11. The synthesiser 11 also controls tuning of the filter 60, which is offset from the frequency of the oscillator by the IF.

The output of the frequency changer is connected via a bandpass surface acoustic wave (SAW) filter 12 to a quadrature down-converter 13. The down-converter 13 comprises an amplifier 14 which supplies the filtered IF signal to multipliers 15 and 16 whose outputs are connected via amplifiers 17 and 18, respectively, to in-phase (I) and quadrature (Q) outputs. A reference oscillator 19 generates a signal whose frequency is equal to the intermediate frequency. This signal is supplied to the multipliers 15 and 16 via a phase adjusting network 20 so that the multipliers 15 and 16 receive signals which are in quadrature i.e. 90° out of phase which each other.

The oscillator 19 has a frequency-determining tuned circuit 21 which is connected to receive a Costas feedback signal from a Costas de-rotation circuit in a quadrature phase shift keyed (QPSK) demodulator to which the I and Q outputs of the down-converter 13 are connected. Such a demodulator with Costas de-rotation circuitry is well known.

In use, the input signal is amplified and gain-controlled by the RF amplifier 2 and converted by the frequency changer to the IF signal. The synthesiser 11 provides tuning for selecting the frequency of the input signal to be received and demodulated. The down-converter 13 converts the IF signal to baseband in-phase and quadrature output signals which are supplied to the demodulator (not shown). The demodulator supplies the Costas feedback signal to the tuned circuit 21 of the reference oscillator 19 so as to control the phase of the output signal of the oscillator 19 and hence the phases of the quadrature signals supplied to the multipliers 15 and 16. This control loop ensures that the I output supplies the in-phase signal substantially uncontaminated with the quadrature signal whereas the Q output supplies the quadrature signal substantially uncontaminated by the in-phase signal.

Although this known type of digital tuner provides acceptable performance, it is relatively complicated and relatively expensive to manufacture. For example, the parts of the timer illustrated in FIG. 1 have to be fabricated with several integrated circuits and with an external front end and often require alignment of the tracking filter.

Another known type of digital tuner for use in DBS receivers differs from that illustrated in FIG. 1 in that the de-rotation function is performed by subsequent digital signal processing (DSP) techniques. The Costas feedback signal to the tuned circuit 21 is thus unnecessary and the reference oscillator 19 is free-running i.e. not phase-locked. The output signals from the amplifiers 17 and 18 each therefore contain both in-phase and quadrature signals which are subsequently extracted by digital signal processing.

FIG. 2 of the accompanying drawings illustrates another known type of digital tuner for use in a DBS receiving system. The tuner is of the ZIF type and converts the input signal in a single conversion step to the base-band signals. The tuner illustrated in FIG. 2 differs from that illustrated in FIG. 1 in that the frequency changer and down-converter are combined into a single frequency changer stage 13, which comprises the amplifiers 14, 17, 18 and multipliers 15 and 16 with the oscillator 9, the variable tuned circuit 10 and the synthesiser 11. The bandpass filter 12 is eliminated and the I and Q outputs are supplied via low-pass filters 22 and 23.

The frequency of the oscillator 9 set by the synthesiser 11 is at or very near the centre frequency of the channel containing the desired input signal as supplied by the RF amplifier 2. Local oscillator signals are supplied in quadrature by the phase adjusting network 20 to the first and second multipliers 15 and 16, which supply base-band demodulated signals via the low-pass filters 22 and 23 to subsequent digital signal processing circuitry for performing de-rotation to retrieve the orthogonal in-phase and quadrature modulation signals.

Although the ZIF tuner shown in FIG. 2 represents a substantial simplification compared with the tuner shown in FIG. 1, it is still not possible to form all of the main tuner circuitry in a single integrated circuit and achieve the necessary performance for acceptable results.

The problems with such a tuner architecture result from the fact that the local oscillator frequency in the frequency changer 13 is within the frequency band or channel of the desired input signal. Because the two signals are of substantially the same frequency, any signal leakage which inevitably occurs results in interference between the signals as explained below.

Leakage of the local oscillator signal to the RF input has two effects. First, such leakage results in re-radiation of the local oscillator signal to other tuners which may be connected to the same antenna system or may be located nearby. Although this problem may be substantially overcome by providing an external front end as illustrated at 2 in FIG. 2 having sufficient "reverse isolation" to meet tuner re-radiation specification requirements, it is then impossible to provide an "internal" RF amplifier 2, for example within the integrated circuit in which the main parts of the frequency changer 13 are formed.

Second, local oscillator signals leaking to the input are amplified and supplied with the input signal to the frequency changer 13. Because of phase shifts which are inherent in such leakage mechanisms and because of amplification within the ZIF tuner, this results in a DC imbalance at the outputs of the frequency changer 13. Such a DC imbalance can represent a significant fraction of the desired signal and cannot be improved because of limits to the degree of isolation which is achievable.

Leakage also occurs from the RF input to the local oscillator and this results in "injection pulling" of the local oscillator 9. This in turn degrades the phase noise and hence the quality of the signal supplied by the oscillator 9 to the multipliers 15 and 16, resulting in reduced signal-to-noise performance of the tuner. Injection pulling results from the injection of the RF signal into the oscillator, which is in effect a tuned amplifier with a low Q feedback network at the oscillation frequency. The injected RF signal is amplified within the oscillator loop and effectively impresses its characteristic on the output of the reference oscillator 9. The RF signal carries a pseudo random noise (PSRN) type modulation and appears like broadband noise, which is impressed on the oscillator signal and thus degrades the noise performance.

The degradation caused by injection pulling to the oscillator phase noise performance thus limits the application of ZIF techniques within DBS applications because lower data rates require a very pure local oscillator signal in order to achieve satisfactory performance. In practice, in order to achieve satisfactory performance with ZIF techniques, a relatively low amplitude input signal must be supplied to the input of the ZIF circuit and this results in disadvantages such as reduced dynamic range. Alternatively or additionally, complex techniques must be used in order to suppress injection pulling so as to achieve the desired standard of performance.

It is known in other applications to form the reference oscillator "on chip" so as to reduce oscillator coupling, for which the dominant leakage mechanism is through parasitic components in integrated circuit packaging and by electromagnetic coupling to and from oscillator strip lines. Such techniques have been used, for example, in global positioning satellite (GPS) receiver systems, for example as disclosed in Schaeffer Shahani et al, "A 115 mW CMOS GPS Receiver", ISSCC98 paper Ref. FA 8.1. However, such integrated oscillators have such inherently poor phase noise characteristics that they are totally unsuitable for use in DES receiving systems. Also, such techniques have been applied to conventional super-heterodyning architectures but have not been applied to ZIF architectures.

It is well-known that an oscillator with poor phase noise performance can be improved by applying a phase-locked loop to control the phase noise within the loop bandwidth. Such techniques are, for example, disclosed in "Digital PLL Frequency Synthesisers", Rohde, Prentice Hall, 1983, ISBN 013 214 293-2. However, this provides no improvement in phase noise outside the loop bandwidth. The maximum loop bandwidth which may be applied is determined by the required reference oscillator frequency step size and is of the order of a few kilohertz. Thus, the integrated phase noise outside this bandwidth has a significant detrimental effect on performance.

GB 2 319 913 discloses a superheterodyne receiver of the double conversion type. A local oscillator for the first mixer is phase-locked via a fixed frequency divider to a local oscillator for the second mixer. The second oscillator is, in turn, phase-locked to a reference frequency.

U.S. Pat. No. 4,607,393 discloses a receiver for receiving and demodulating multiplexed stereo signals which art frequency modulated on a carrier. The receiver is of the single conversion type which converts the incoming broadcast band frequencies to an intermediate frequency of 10.7 MHz. The mixer receives a local oscillator signal which is phase-locked to a further local oscillator. The further local oscillator is phase-locked at a multiple of the frequency of the pilot tone of the demodulated stereo multiplexed signal.

EP 0 253 680 discloses a receiver for receiving and demodulating an angle modulated signal of a mobile subscriber set. The receiver is of the double conversion type with a first mixer receiving the output of a local oscillator which is phase-locked to a temperature controlled crystal oscillator. The crystal oscillator is capable of being tuned over a narrow frequency range, which is controlled with reference to the received signal after the second conversion but prior to demodulation.

SUMMARY OF THE INVENTION

According to a first aspect of the invention, there is provided a frequency changer of zero or near-zero intermediate frequency type, comprising a first multiplier having a first input for receiving an input signal in a first frequency band and a second input connected to an oscillator arrangement, which comprises a first oscillator for supplying a first signal in the first frequency band to the second input of the multiplier, a second oscillator for producing a second signal in a second frequency band outside the first frequency band, and a reference oscillator, the first oscillator being phase-locked to the second oscillator and the second oscillator being phase-locked to the reference oscillator.

The second frequency band may be lower than the first frequency band.

The first frequency band may be within or substantially equal to 950 to 2150 MHz.

The second frequency may be within the UHF band, for example within or substantially equal to 400 to 600 MHz.

The multiplier may have an output for supplying an output signal to a low pass filter.

The low pass filter may have a cut-off frequency of between 5 MHz and 40 MHz. The frequency changer may comprise a second multiplier having a first input for receiving the input signal and a second input connected to the oscillator arrangement for receiving a quadrature signal which is in quadrature with the first signal. The first oscillator may be connected to a phase adjusting network for forming the first signal and the quadrature signal. As an alternative, the first oscillator may comprise a ring oscillator having first and second outputs for supplying the first signal and the quadrature signal.

The first and second oscillators may form part of a first phase-locked loop comprising a first programmable divider, a first comparator having a first input connected via the first divider to the first oscillator and a second input connected to the second oscillator, and a first control loop connected between the output of the first comparator and a control input of the first oscillator. The first programmable divider may have selectable devisors of 2,3 and 4.

The second and reference oscillators may form part of a second phase-locked loop comprising: a second comparator having a first input connected via a second programmable divider to the second oscillator and a second input connected via a third programmable divider to the reference oscillator; and a second control loop connected between the output of the second comparator and a control input of the second oscillator.

The first multiplier and the oscillator arrangement may be formed in a monolithic integrated circuit. The second multiplier may be formed in the integrated circuit. The first phase-locked loop may be formed in the integrated circuit. The second phase-locked loop may be formed in the integrated circuit. The second oscillator may comprise a frequency-determining resonant circuit disposed externally of the integrated circuit. The frequency changer may comprise an amplifier connected between the first input of the first multiplier and an input terminal and formed in the integrated circuit. The amplifier may have a controllable gain for providing automatic gain control.

According to a second aspect of the invention, there is provided a digital tuner comprising a frequency changer according to the first aspect of the invention.

Such arrangements provide substantial improvements in tuner performance, for example making substantially fully integrated ZIF tuners with acceptable performance a practical possibility. The second oscillator can be phase-locked, for example by a low noise PLL frequency synthesiser incorporating the reference oscillator, and so has very good phase noise performance because it can be required to tune over a relatively narrow frequency range and hence have a high Q. By phase-locking the first oscillator to the second oscillator, the resulting local oscillator signal for mixing or multiplying with the input signal has very low phase noise and is resistant to injection pulling. For example, the feedback bandwidth of the control loop for the first oscillator can be arranged to be high enough to cover the bandwidth of the input signal so that the free-running phase noise of the first oscillator is greatly reduced by the phase-locking to the second oscillator. It is thus possible to provide, for example, a ZIF digital tuner which is suitable for DBS applications and which can be formed as a single monolithic integrated circuit with very few external or off-chip components.

BRIEF DESCRIPTION OF THE DRAWING

The present invention will be further described, by way of example, with reference to the accompanying drawings, in which.

Like reference numerals refer to like parts throughout the drawings.

DESCRIPTION OF THE PREFERRED EMBODIMENTS

Figure 3:
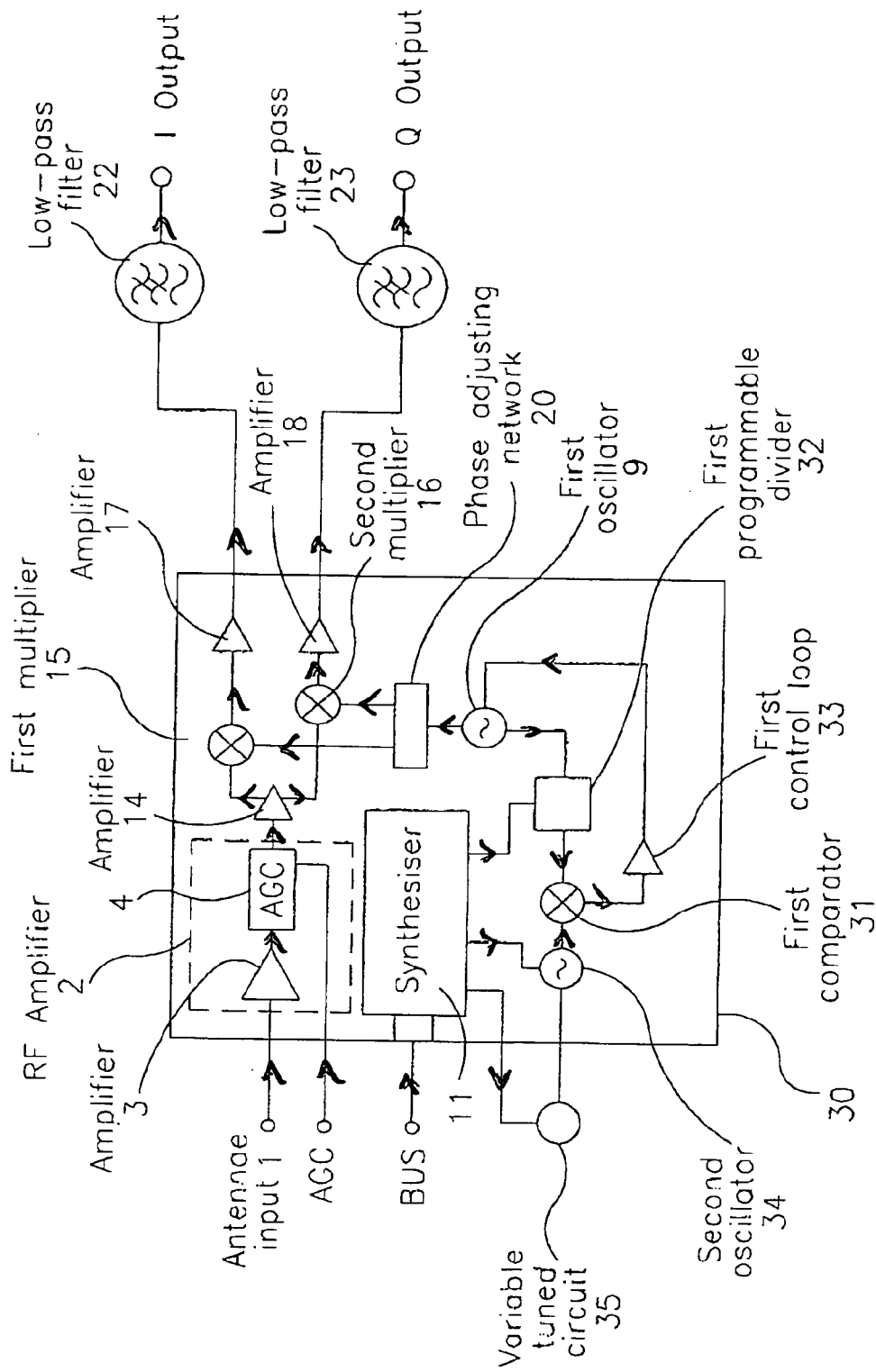
FIG. 3 is a block circuit diagram of a digital tuner and frequency changer constituting an embodiment of the invention.

The digital tuner and frequency changer shown in FIG. 3 comprise a ZIF tuner for receiving and demodulating QPSK signals, for example in a DBS receiver system. The tuner receives input signals in an input frequency band which is typically from 950 to 2150 MHz. A plurality of channels are located within this input band, for example having centre frequencies which are equally spaced, for example at the Nyquist bandwidth.

Figure 1:
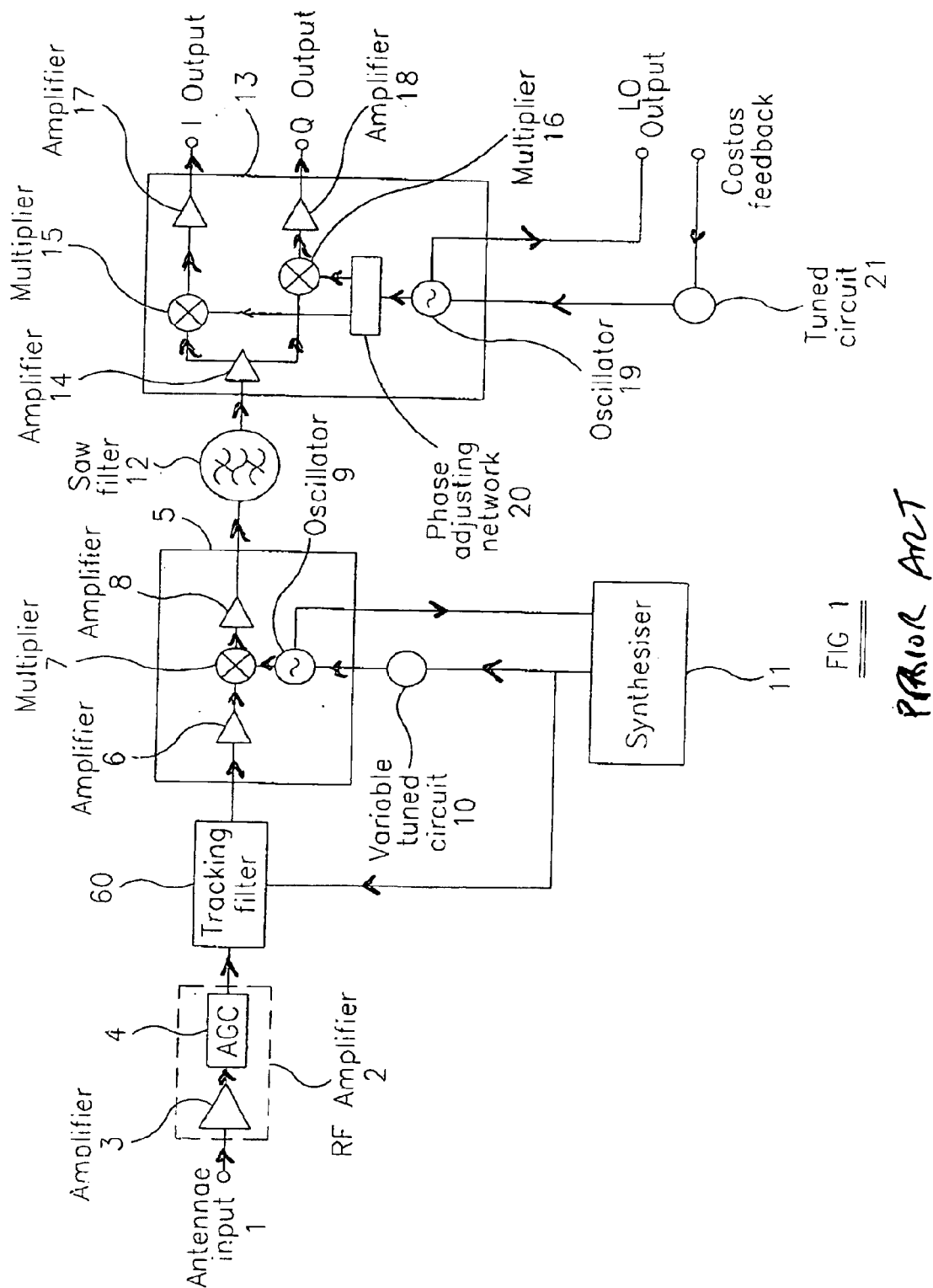
FIG. 1 is a block circuit diagram of a first known type of digital tuner.
Figure 2:
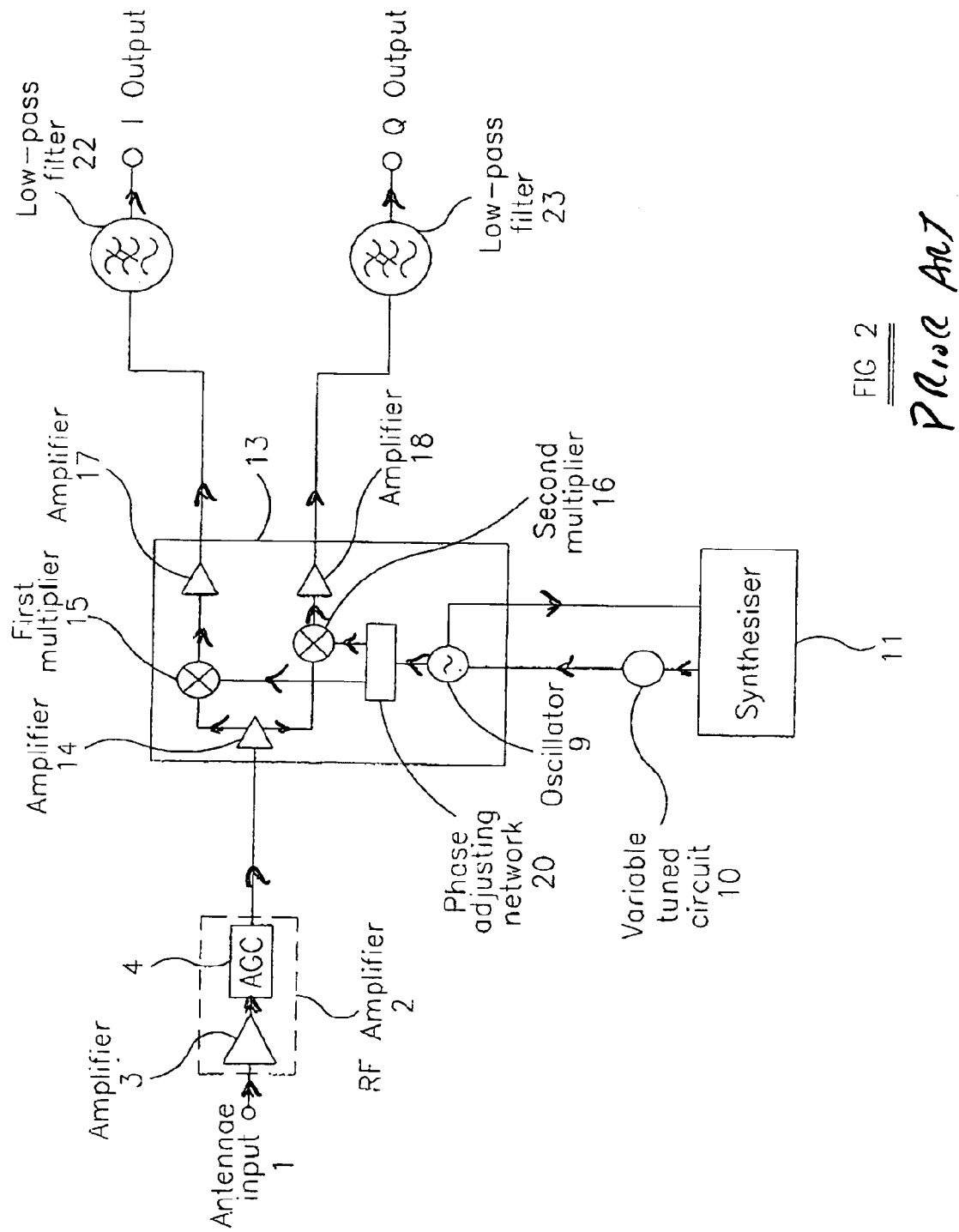
FIG. 2 is a block circuit diagram of a second known type of digital tuner.

The tuner effectively comprises a frequency changer in the form of a single monolithic integrated circuit 30 with very few external components. The frequency changer is of the ZIF type and is similar to that shown in FIG. 2. Accordingly, those elements and components of the tuner shown in FIG. 3 which are the same as the corresponding elements and components shown in FIG. 2 will not be described again in detail.

The frequency changer 30 includes the RF amplifier 2 within the integrated circuit and has an AGC input for receiving a control voltage from an arrangement of known type (not shown) for controlling the gain of the RF amplifier 2 so as to present to the amplifier 14 input signals of substantially constant maximum amplitude substantially irrespective, within the gain control range, of the amplitude of input signals supplied to the antenna input 1.

The first oscillator 9 generates a local oscillator signal which is supplied in quadrature by the phase adjusting network 20 to the first and second multipliers 15 and 16. The synthesiser 11 has a BUS input for selecting the desired input channel and controls the oscillator arrangement including the first oscillator 9 so that the signals supplied by the first oscillator 9 have a frequency which can be tuned within the input frequency band of 950 to 2150 MHz.

The first oscillator 9 forms part of a phase-locked loop which comprises a first comparator 31, a first programmable divider 32 and a first control loop 33. The first programmable divider 32 has a division ratio or divisor which is selectable by the BUS signals to be 2, 3 or 4. The output signal of the first oscillator 9 is divided by the divisor selected in the divider 32 and supplied to one input of the first comparator 31, whose other input receives signals from a second oscillator 34. The first comparator 31 comprises a frequency/phase comparator which forms an error signal for driving the first control loop 33, which comprises an amplifier and loop filter whose bandwidth is at least as large as the bandwidth of the input signals supplied to the antenna input I. The amplified and filtered feedback signal is supplied to a frequency control input of the first oscillator 9, whose output frequency is therefore twice, three times or four times the frequency of the output signal of the second oscillator 34. The phase noise of the first oscillator 9 within the control loop bandwidth is therefore substantially determined by the phase noise performance of the second oscillator 34. Thus, the first oscillator 9 is substantially immune to injection pulling.

Because the first oscillator 9 is located in the integrated circuit forming the frequency changer 30, signal leakage is substantially reduced. The performance of the amplifier 3 is such that local oscillator leakage to the input I can be substantially reduced so that re-radiation interference to other tuners connected to the antenna system can be reduced to acceptable limits. Similarly, leakage of local oscillator signals to the frequency changer input is at a sufficiently low level to avoid significant DC shifting of the I and Q outputs. Further the immunity to injection pulling allows the full unattenuated signal to be supplied to the amplifier 3 and later stages so that the dynamic range performance of the frequency changer does not need to be compromised in order to avoid or reduce injection pulling.

Figure 4:
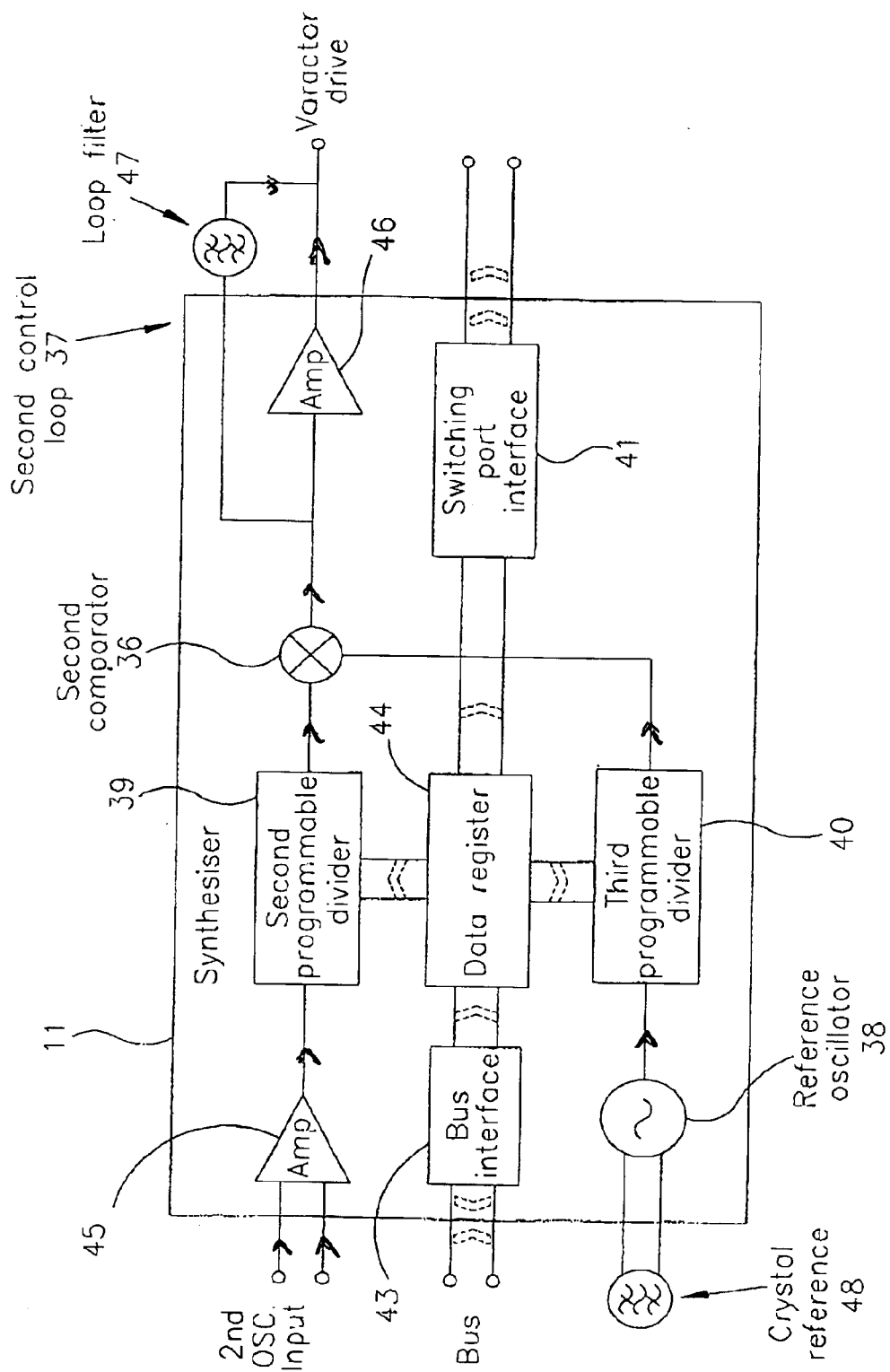
FIG. 4 is a block circuit diagram of a synthesiser of the tuner shown in FIG. 3.

The second oscillator 34 has a frequency range which is typically 400 to 600 MHz within the UHF band. The frequency of oscillation is determined by a variable tuned circuit 35, for example of the varactor diode tuned type, which is located externally to the integrated circuit 30 ("off-chip"). The second oscillator 34 forms part of a second phase-locked loop which, as shown in FIG. 4, also comprises the main elements of the synthesiser 11. In particular, the second phase-locked loop comprises the second oscillator 34, a second comparator 36, a second control loop 37, a reference oscillator 38, and second and third programmable dividers 39 and 40. In addition, the synthesiser 11 comprises a data register 44 for supplying control signals for setting the division ratios or divisors of the second and third programmable dividers 39 and 40 and for setting via a switching port interface 41 the divisor in the first programmable divider 32. A BUS interface 43 provides interfacing between the input BUS and the data register 44.

The output of the second oscillator 34 is connected via an input and an amplifier 45 to the second programmable divider 39 which divides the frequency by a divisor as set by the data register 44 and supplies the resulting frequency-divided signal to one input of the second comparator 36, which operates as a frequency/phase comparator. The other input of the comparator 36 receives the reference oscillator output signal via the programmable divider 40 which likewise divides the frequency in accordance with a divisor as set by the data register 44. The second comparator 36 produces an output signal which is supplied via the second control loop 37, which comprises an amplifier 46 and a loop filter 47, to the variable tuned circuit 35. The reference oscillator 38 is provided with a crystal reference tuned circuit 48 such that the output frequency of the reference oscillator 38 is fixed to very high stability and the reference oscillator 38 produces very low phase noise.

The phase noise of the second oscillator 34 is effectively determined by the phase noise of the reference oscillator 38 within the bandwidth of the loop filter 47. The crystal-controlled reference oscillator 38 has very low phase noise and the bandwidth of the loop filter 47 is such that the second oscillator 34 has very low phase noise within its loop bandwidth, for example up to a few kilohertz. Thus, the phase noise of the first oscillator 9 is correspondingly low and the first oscillator 9, as described hereinbefore, is substantially immune to injection pulling. This provides the frequency changer and tuner with a very good signal/noise ratio.

The outputs of the frequency changer are supplied via the low-pass filters 72 and 23 which have a cut-off frequency appropriate to the modulation spectrum of the input signals. For example, for typical DSB receiver systems, the cut-off frequency of the filters 22 and 23 is between 5 and 40 MHz.

It is thus possible to provide a digital tuner of the ZIF type in which virtually the whole of the frequency changer can be embodied as a single monolithic integrated circuit. The additional circuitry, for example as compared with the frequency changer shown in FIG. 2, does not significantly increase the complexity of the integrated circuit, which can therefore be easily manufactured without substantial cost penalties. Further, the RF amplifier can be incorporated in the integrated circuit without degradation in performance due to leakage, in particular between the RF input and the local oscillator and vice versa. Thus, injection pulling effects and in-hand local oscillator leakage effects can be greatly reduced or even substantially eliminated.

Figure 5:
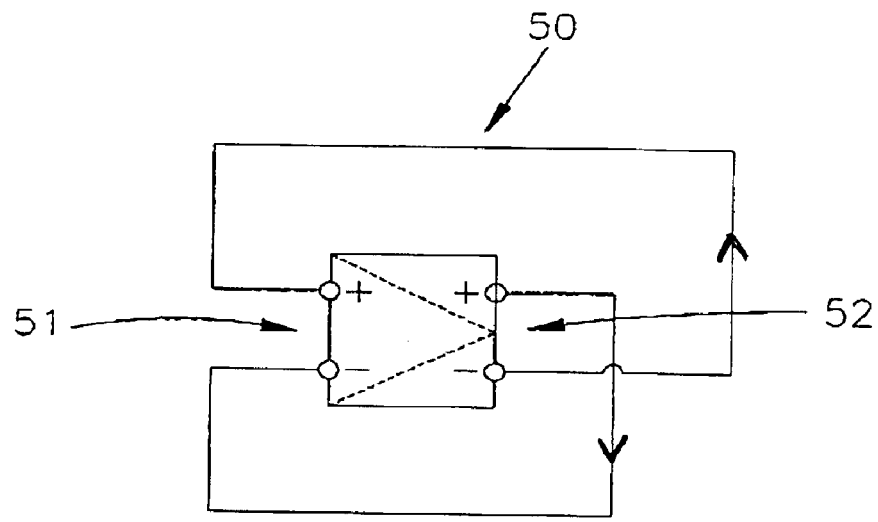
FIG. 5 is a schematic diagram illustrating a single-stage oscillator and a ring oscillator which may be used in the frequency changer shown in FIG. 3.
Figure 5:
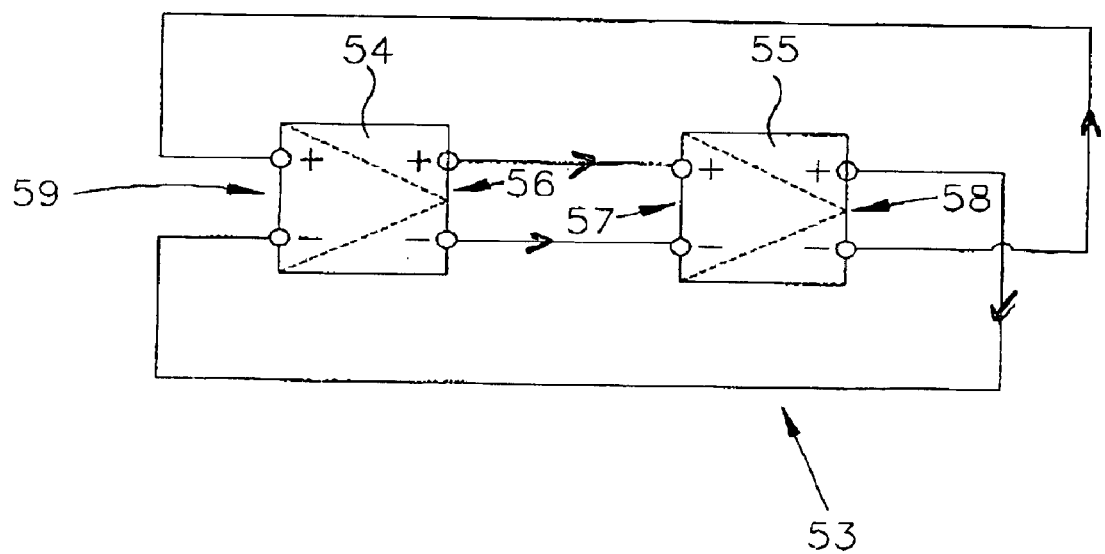

As shown in FIG. 3, the quadrature local oscillator signals required by the first and second multipliers 15 and 16 can be supplied by a single-phase oscillator 9 and a phase adjusting network 20. An alternative oscillator arrangement for generating quadrature local oscillator signals without requiring the phase adjusting network 20 is illustrated in FIG. 5. A conventional oscillator is illustrated schematically at 50 in FIG. 5 and essentially comprises a single gain stage with 180° feedback between the input 51 and the output 52. This arrangement provides a single-phase output signal from the output 52. A ring oscillator is illustrated schematically at 53 and comprises two identical gain stages 54 and 55. The output 56 of the first stage is connected to the input 57 of the second stage 55 with 180' feedback from the output 58 of the second stage 55 to the input 59 of the first stage 54.

In use, the total phase shift across the two identical gain stages 54 and 55 is substantially equal to 180°. Accordingly, the phase shift across each of the stages 54 and 55 is 90°. Thus, the outputs 56 and 58 of the stages 54 and 55 produce local oscillator signals which are accurately in quadrature with each other and which may therefore be supplied directly to the first and second multipliers 15 and 16.

What is claimed is:

1. A digital tuner comprising a single frequency changer of one of a zero intermediate frequency changer and a near-zero intermediate frequency changer, said frequency changer comprising: an oscillator arrangement; a first multiplier having a first input for receiving an input signal in a first frequency band, and a second input connected to said oscillator arrangement; and said oscillator arrangement comprising a first oscillator for supplying a first signal in said first frequency band to said second input of said first multiplier, said first oscillator having a control input a second oscillator for producing a second signal in a second frequency band outside said first frequency band, said first and second oscillators forming part of a first phase-locked loop which comprises a first programmable divider, a first comparator having an output, a first input connected via said first programmable divider to said first oscillator, and a second input connected to said second oscillator, and a first control loop connected between said output of said first comparator and said control input of said first oscillator, said first control loop comprising an amplifier and a loop filter whose bandwidth is at least as large as the bandwidth of the input signals supplied to an antenna input, and a fixed frequency reference oscillator, said first oscillator being phase-locked to said second oscillator, and said second oscillator being phase-locked to said reference oscillator.

2. The tuner as claimed in claim 1, in which said second frequency band is lower than said first frequency band.

3. The tuner as claimed in claim 1, in which said first frequency band is within 950 to 2150 MHz.

4. The tuner as claimed in claim 1, in which said second frequency band is within a UHF band.

5. The tuner as claimed in claim 4, in which said second frequency band is within 400 to 600 MHz.

6. The tuner as claimed in claim 1, comprising a low pass filter, said first multiplier having an output for supplying an output signal to said low pass filter.

7. The tuner as claimed in claim 6, in which said low pass filter has a cut-off frequency of between 5 MHz and 40 MHz.

8. The tuner as claimed in claim 1, comprising a second multiplier having a first input for receiving said input signal, and a second input connected to said oscillator arrangement for receiving a quadrature signal which is in quadrature with said first signal.

9. The tuner as claimed in claim 8, comprising a phase adjusting network, to which said first oscillator is connected, for forming said first signal and said quadrature signal.

10. The tuner as claimed in claim 8, in which said first oscillator comprises a ring oscillator having first and second outputs for supplying said first signal and said quadrature signal.

11. Th tuner as claimed in claim 1, in which said first programmable divider has selectable divisors of two, three and four.

12. The tuner as claimed in claim 1, in which said second oscillator has a control input, and said second and reference oscillators form part of a second phase-locked loop comprising: a second programmable divider; a third programmable divider; a second comparator having an output, a first input connected via said second programmable divider to said second oscillator, and a second input connected via said third programmable divider to said reference oscillator; and a second control loop connected between said output of said second comparator and said control input of said second oscillator.

13. The tuner as claimed in claim 1, in which said first multiplier and said oscillator arrangement are formed in a monolithic integrated circuit.

14. A frequency changer of one of a zero intermediate frequency changer and a near-zero intermediate frequency changer, comprising: an oscillator arrangement; a first multiplier having a first input for receiving an input signal in a first frequency band, and a second input connected to said oscillator arrangement; and said oscillator arrangement comprising a first oscillator for supplying a first signal in said first frequency band to said second input of said first multiplier, a second oscillator for producing a second signal in a second frequency band outside said first frequency band, and a reference oscillator, said first oscillator being phase-locked locked to said second oscillator, said second oscillator being phase-locked to said reference oscillator, said first oscillator having a control input, and said first and second oscillators forming part of a first phase-locked loop comprising: a first programmable divider having selectable divisors of two, three and four; a first comparator having an output, a first input connected via said first programmable divider to said first oscillator, and a second input connected to said second oscillator; and a first control loop connected between said output of said first comparator and said control input of said first oscillator, said first control loop comprising an amplifier and a loop filter whose bandwidth is at least as large as the bandwidth of the input signals supplied to an antenna input.

15. The frequency changer as claimed in claim 14, in which said second frequency band is lower than said first frequency band.

16. The frequency changer as claimed in claim 14, in which said first frequency band is within 950 to 2150 MHz.

17. The frequency changer as claimed in claim 14, in which said second frequency band is within a UHF band.

18. The frequency changer as claimed in claim 17, in which said second frequency band is within 400 to 600 MHz.

19. The frequency changer as claimed in claim 14, comprising a low pass filter, said first multiplier having an output for supplying an output signal to said low pass filter.

20. The frequency changer as claimed in claim 19, in which said low pass filter has a cut-off frequency of between 5 MHz and 40 MHz.

21. The frequency changer as claimed in claim 14, comprising a second multiplier having a first input for receiving said input signal, and a second input connected to said oscillator arrangement for receiving a quadrature signal which is in quadrature with said first signal.

22. The frequency changer as claimed in claim 21, comprising a phase adjusting network, to which said first oscillator is connected, for forming said first signal and said quadrature signal.

23. The frequency changer as claimed in claim 21, in which said first oscillator comprises a ring oscillator having first and second outputs for supplying said first signal and said quadrature signal.

24. The frequency changer as claimed in claim 21, in which said second oscillator has a control input, and said second and reference oscillators form part of a second phase-locked loop comprising: a second programmable divider; a third programmable divider; a second comparator having an output, a first input connected via said second programmable divider to said second oscillator, and a second input connected via said third programmable divider to said reference oscillator; and a second control loop connected between said output of said second comparator and said control input of said second oscillator.

25. The frequency changer as claimed in claim 14, in which said first multiplier and said oscillator arrangement are formed in a monolithic integrated circuit.

26. A frequency changer of one of a zero intermediate frequency changer and a near-zero intermediate frequency changer, comprising: an oscillator arrangement; a first multiplier having a first input for receiving an input signal in a first frequency band, and a second input connected to said oscillator arrangement; and said oscillator arrangement comprising a first oscillator for supplying a first signal in said first frequency band to said second input of said first multiplier, a second oscillator for producing a second signal in a second frequency band outside said first frequency band, and a reference oscillator, said first oscillator being phase-locked to said second oscillator, said second oscillator being phase-locked to said reference oscillator, said first oscillator having a control input, and said first and second oscillators forming part of a first phase-locked loop comprising: a first programmable divider; a first comparator having an output, a first input connected via said first programmable divider to said first oscillator, and a second input connected to said second oscillator; and a first control loop connected between said output of said first comparator and said control input of said first oscillator, said first control loop comprising an amplifier and a loop filter whose bandwidth is at least as large as the bandwidth of the input signals supplied to an antenna input.

27. The frequency changer as claimed in claim 16, in which said second frequency band is lower than said first frequency band.

28. The frequency changer as claimed in claim 27, in which said first frequency band is within 950 to 2150 MHz.

29. The frequency changer as claimed in claim 26, in which said second frequency band is within a UHF band.

30. The frequency changer as claimed in claim 29, in which said second frequency band is within 400 to 600 MHz.

31. The frequency changer as claimed in claim 26, comprising a low pass filter, said first multiplier having an output for supplying an output signal to said low pass filter.

32. The frequency changer as claimed in claim 31, in which said low pass filter has a cut-off frequency of between 5 MHz and 40 MHz.

33. The frequency changer as claimed in claim 26, comprising a second multiplier having a first input for receiving said input signal, and a second input connected to said oscillator arrangement for receiving a quadrature signal which is in quadrature with said first signal.

34. The frequency changer as claimed in claim 33, comprising a phase adjusting network, to which said first oscillator is connected, for forming said first signal and said quadrature signal.

35. The frequency changer as claimed in claim 33, in which said first oscillator comprises a ring oscillator having first and second outputs for supplying said first signal and said quadrature signal.

36. The frequency changer as claimed in claim 26, in which said first programmable divider has selectable divisors of two, three and four.

37. The frequency changer as claimed in claim 26, in which said second oscillator has a control input, and said second and reference oscillators form part of a second phase-locked loop comprising: a second programmable divider; a third programmable divider; a second comparator having an output, a first input connected via said second programmable divider to said second oscillator, and a second input connected via said third programmable divider to said reference oscillator; and a second control loop connected between said output of said second comparator and said control input of said second oscillator.

38. The frequency changer as claimed in claim 26, in which said first multiplier and said oscillator arrangement are formed in a monolithic integrated circuit.

* * * * *